(12) United States Patent
Nguyen

(10) Patent No.: US 6,515,486 B1
(45) Date of Patent: Feb. 4, 2003

(54) METHOD AND STRUCTURE TO DETERMINE LOW THRESHOLD VOLTAGE AND HIGH THRESHOLD VOLTAGE

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 331 days.

(21) Appl. No.: 09/603,461

(22) Filed: Jun. 22, 2000

(51) Int. Cl.⁷ .................. G01R 27/28; G01R 31/26; G01D 3/02; G06F 17/50
(52) U.S. Cl. .................. 324/615; 324/765; 702/109; 716/4
(58) Field of Search .................. 324/615, 765, 324/620; 702/109; 703/3, 13, 14, 16; 716/4, 3; 714/721, 740, 745

(56) References Cited

U.S. PATENT DOCUMENTS

| | | | | |
|---|---|---|---|---|
| 3,723,718 A | * | 3/1973 | Jaffe et al. | 327/156 |
| 3,969,633 A | * | 7/1976 | Paluck et al. | 326/58 |
| 4,511,978 A | * | 4/1985 | Reng | 318/803 |
| 5,327,129 A | * | 7/1994 | Soenen et al. | 324/615 |
| 6,242,895 B1 | * | 6/2001 | Fujii et al. | 323/207 |

\* cited by examiner

*Primary Examiner*—N. Le
*Assistant Examiner*—Anjan K. Deb
(74) *Attorney, Agent, or Firm*—Edward S. Mao; Bever Hoffman & Harms (57) ABSTRACT

A method is provided for quickly determining low threshold voltages and high threshold voltages of a test circuit. Specifically, a transformed voltage transfer curve for the test circuit is generated. The maximum and minimum points of the transfer circuit are determined to calculate transformed voltage threshold values. The transformed voltage threshold are transformed to find the desired threshold voltages.

29 Claims, 8 Drawing Sheets

METHOD AND STRUCTURE TO DETERMINE LOW THRESHOLD VOLTAGE AND HIGH THRESHOLD VOLTAGE

BACKGROUND OF THE INVENTION

1. Field of the Invention

The present invention relates to integrated circuits. More specifically, the present invention relates to methods for determining low threshold voltage $V\_il$ and high threshold voltage $V\_ih$.

2. Discussion of Related Art

Due to advancing semiconductor processing technology, each new generation of integrated circuits has greatly increased in speed, functionality and complexity as compared to previous generations. However, each new generation of ICs must also undergo intensive testing and characterization to determine the operating parameters of the ICs. Important operating parameters are usually derived from the voltage transfer curve of the various components of the IC.

Figure 1A:
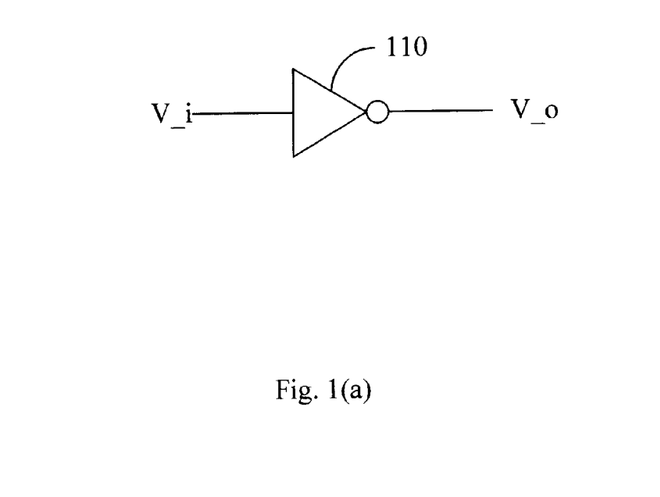
FIG. 1(a) is a schematic diagram of an inverter.
Figure 1B:
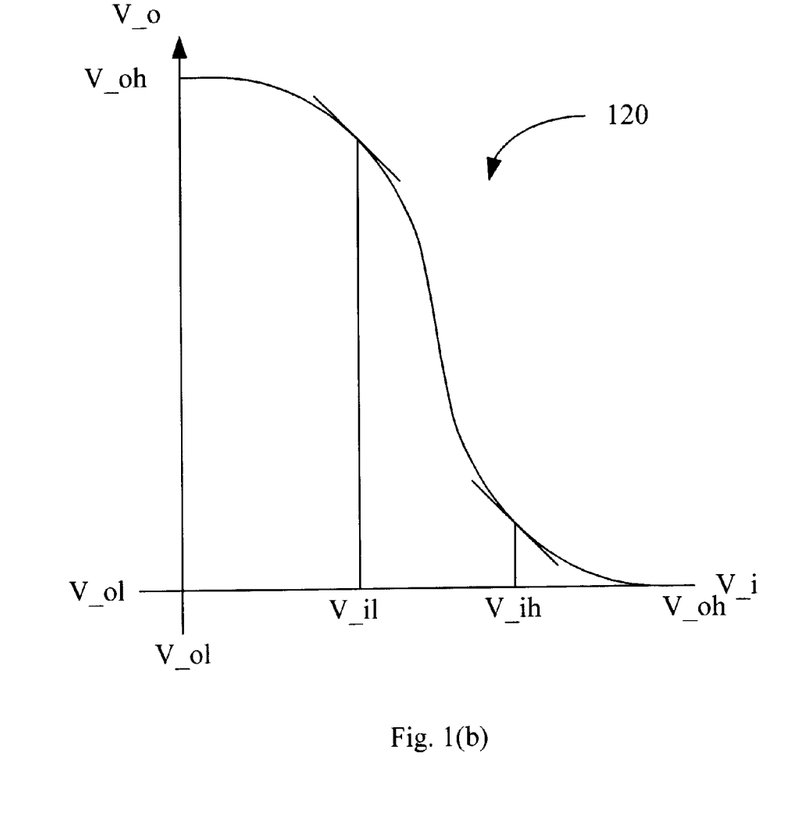
FIG. 1(b) is a voltage transfer curve for an inverter.

The voltage transfer curve shows the voltage level of an output voltage signal $V\_o$ of a test circuit for various voltage levels of an input voltage signal $V\_i$. For example, as shown in FIG. 1(a), input voltage signal $V\_i$ is applied on the input terminal of an inverter 110. Inverter 110 drives output voltage signal $V\_o$ on the output terminal of inverter 110. FIG. 1(b) shows a voltage transfer curve 120 of inverter 110. The voltage range for inverter 110 is from a logic low voltage level $V\_ol$ to a logic high voltage level $V\_oh$. Ideally, inverter 110 drives output voltage signal $V\_o$ to logic high voltage level $V\_oh$ when input voltage signal $V\_i$ is equal to logic low voltage level $V\_ol$. Conversely, inverter 110 drives output voltage signal $V\_o$ to logic low voltage level $V\_ol$ when input voltage signal $V\_i$ is equal to logic high voltage level $V\_oh$. Typically, voltage transfer curve 120 is derived by driving input voltage signal $V\_i$ from low voltage level $V\_ol$ to high voltage level $V\_oh$ at specified increments and capturing the voltage level of output voltage signal $V\_o$ at each increment.

In actual application, input voltage signal $V\_i$ may be slightly higher than logic low voltage level $V\_ol$ or slightly lower than logic high voltage level $V\_oh$. Thus, ICs are designed to treat any voltage level between logic low voltage level $V\_ol$ and a low threshold voltage level $V\_il$ as logic low. Similarly, ICs are designed to treat any voltage level between logic high voltage level $V\_oh$ and a high threshold voltage level $V\_ih$ as logic high.

Thus, the range of acceptable logic low voltage levels is logic low voltage level $V\_ol$ to low threshold voltage level $V\_il$, inclusive. Similarly, the range of acceptable logic high voltage levels is high threshold voltage level $V\_ih$ to logic high voltage level $V\_oh$, inclusive. As shown in FIG. 1(b) for inverter 110, low threshold voltage level $V\_il$ is equal to the voltage level of input voltage signal $V\_i$ where voltage transfer curve 120 first has a slope of negative one (−1). High threshold voltage level $V\_ol$ is equal to the voltage level of input voltage signal $V\_i$ where voltage transfer curve 120 next has a slope of negative one (−1) (determining the slope is described in more detail below).

When a new generation of ICs is produced, operating parameters, such as low threshold voltage levels $V\_il$ and high threshold voltage level $V\_ol$ must be provided to engineers who will use the new IC. Conventional methods to determine low threshold voltage level $V\_il$ and high threshold voltage level $V\_ih$ are time consuming and inaccurate. For example, a common way to determine low threshold voltage levels $V\_il$ and high threshold voltage $V\_ih$ is to either simulate the IC using a simulator, such as HSPICE, or use a voltage tester to graph a voltage transfer curve of the IC. With either a simulator or a voltage tester, the voltage transfer curve is typically determined using a point by point process by setting the voltage level of input voltage signal $V\_i$ equal to low voltage level $V\_ol$ and then slowly incrementing the voltage level of input voltage signal $V\_i$ until the voltage level of input voltage signal $V\_i$ equals or exceeds high voltage level $V\_oh$. Thus, the voltage transfer curve is drawn using a large set of data points, rather than, using an equation. Without an equation, the mathematical derivative of the voltage transform curve can not be used to determine the slope of the voltage transfer curve. Thus, a test engineer determines the voltage at which the voltage transfer curve has a slope of negative one (−1) by visual inspection of the voltage transfer graph. To do this, the test engineer must select the graphing parameters so that input voltage signal $V\_i$ and output voltage signal $V\_o$ are graphed using the same scale. However, the resulting voltage levels determined by the test engineer is not very accurate due to the ad hoc nature of the measurement. Furthermore, the visual display of the voltage transfer curve may vary depending on the scale used in the graph of the voltage transfer curve which may cause further inaccuracies of the measured voltage transfer curve. Hence, there is a need for a method to accurately determine low threshold voltage level $V\_il$ and high threshold voltage level $V\_ih$ for integrated circuits.

SUMMARY

The present invention uses transform circuits to transform a voltage transfer curve to a transformed voltage transfer curve. Rather than measuring the slope of the voltage transfer curve, low threshold voltage levels $V\_il$ and high threshold voltage level $V\_ih$ can be determined by finding the maximum and minimum points of the transformed voltage transfer curve, respectively.

Specifically, in accordance with some embodiments of the present invention, a transform circuit transforms the voltage transfer curve of a test circuit to create a transformed voltage transfer curve. The maximum and minimum points on the voltage transform curve are determined to calculate transformed voltage thresholds. The transformed voltage thresholds are transformed into the desired voltage threshold by reversing the transformation used to create the transformed voltage transfer curve.

In a specific embodiment of the present invention, the transformed voltage transfer curve is formed by rotating the voltage transfer curve by 45 degrees clockwise. Thus, the transformed voltage thresholds can be calculated by rotating 45 degrees clockwise. The present invention will be more fully understood in view of the following description and drawings.

DETAILED DESCRIPTION

As explained above, conventional methods using the slope of the voltage transfer curve to determine low voltage threshold $V\_il$ and high voltage threshold $V\_ih$ are imprecise and time consuming. Therefore, the present invention transforms the voltage transfer curve so that low voltage threshold $V\_il$ and high threshold voltage $V\_ih$ can be determined by measuring the maximum and minimum points of a transformed voltage transfer curve rather than the slope of the voltage transfer curve.

Figure 2:
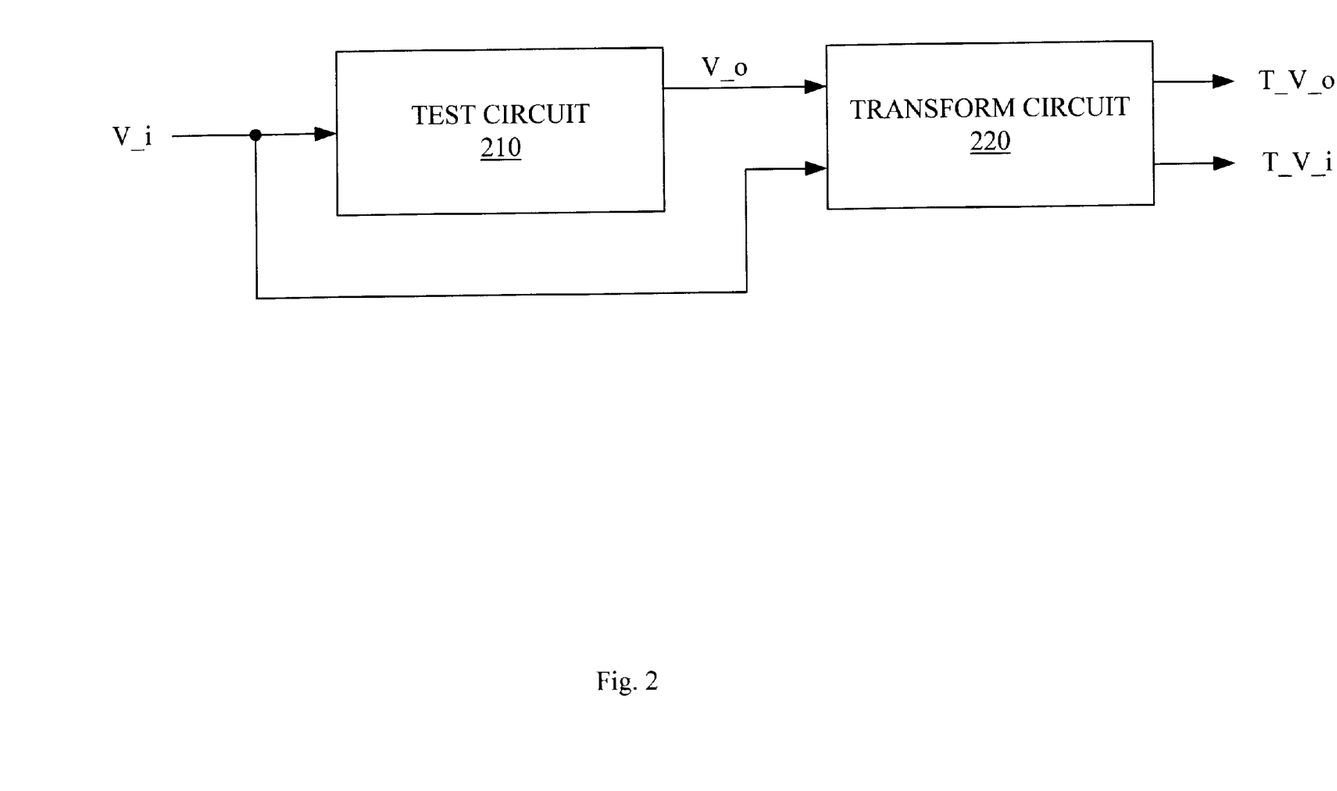
FIG. 2 is a schematic diagram of one embodiment of the present invention.

FIG. 2 shows an embodiment of the present invention which transforms a voltage transfer curve of a test circuit 210 using transform circuit 220. Specifically, test circuit 210 represents the new circuit to be tested. For clarity, the examples herein (unless otherwise indicated) use an inverter for test circuit 210. However, any circuit can be tested using the principles of the present invention. As illustrated in FIG. 2, input voltage signal $V\_i$ is provided to test circuit 210 and to transform circuit 220. Test circuit 210 drives output voltage signal $V\_o$ to transform circuit 220. Transform circuit 220 transforms input voltage signal $V\_i$ and output voltage signal $V\_o$ to generate transformed input voltage signal $T\_V\_i$ and transformed output voltage signal $T\_V\_o$, respectively. As explained above, the present invention can be used in both simulation and actual testing of test circuit 210. In simulations using tools such as HSPICE, both test circuit 210 and transform circuit 220 would be models of actual circuits. In testing, typically, test circuit 210 is an actual physical circuit while transform circuit 220 is a model in the tester.

Figure 3:
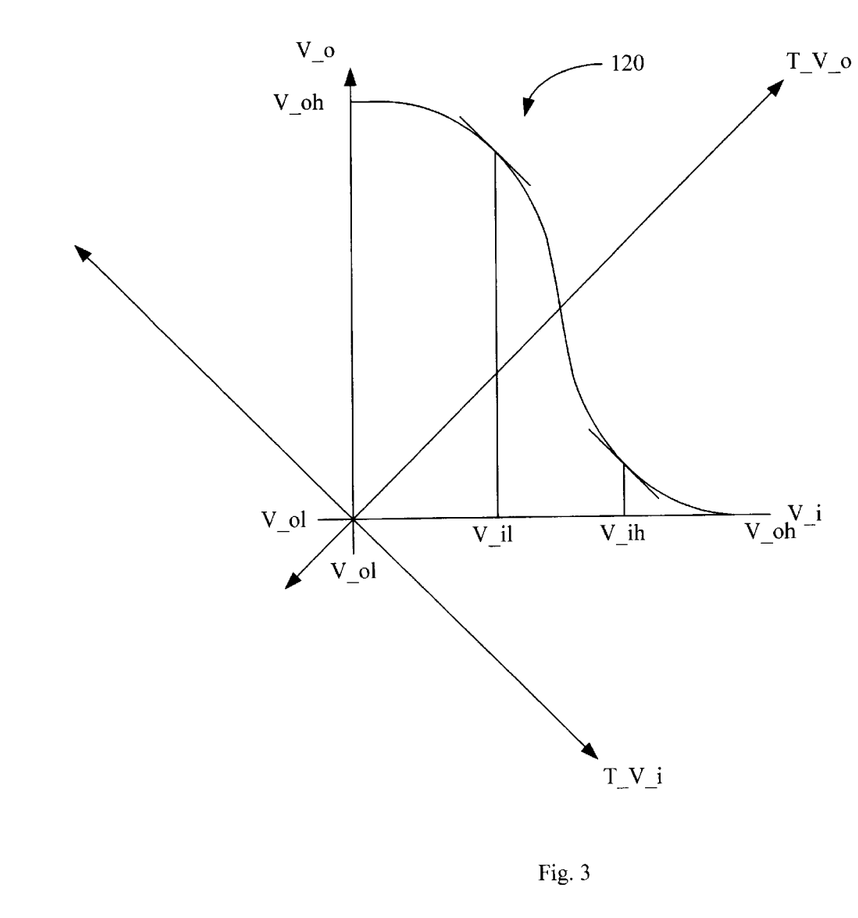
FIG. 3 is a voltage transfer curve including a transformed coordinate system in accordance with one embodiment of the present invention.

FIG. 3 shows the coordinate system of transformed input voltage signal $T\_V\_i$ and transformed output voltage signal $T\_V\_o$ superimposed on voltage transfer curve 120 of FIG. 1. In accordance with the present invention, voltage transfer curve 120 in the new coordinate system is produced by transfer circuit 210. Specifically, as illustrated in FIG. 3, the coordinate system of transformed input voltage signal $T\_V\_i$ and transformed output voltage signal $T\_V\_o$ is rotated 45 degrees clockwise with respect to the coordinate system of input voltage signal $V\_i$ and output voltage signal $V\_o$.

Figure 4:
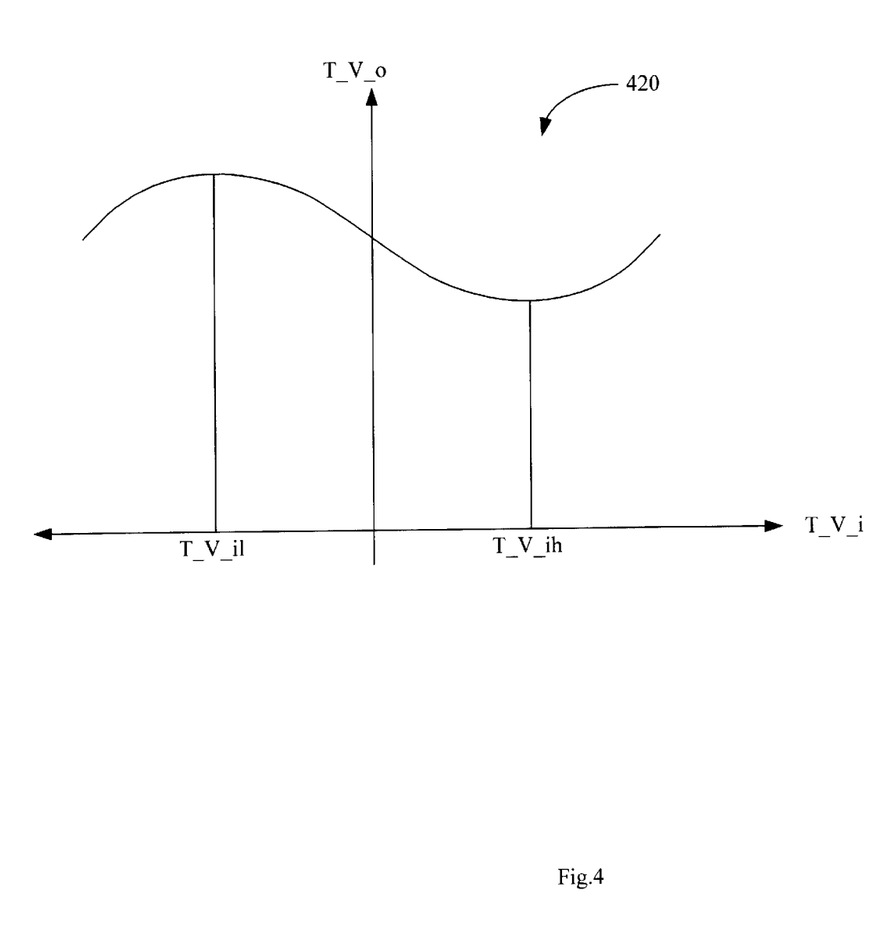
FIG. 4 is a voltage transfer curve using a transformed coordinate system in accordance with one embodiment of the present invention.

FIG. 4 illustrates a transformed voltage transfer curve 420 in the coordinate system of transformed input voltage signal $T\_V\_i$ and transformed output voltage signal $T\_V\_o$. Transformed voltage transfer curve 420 is generated using transformed input voltage signal $T\_V\_i$ and transformed output voltage signal $T\_V\_o$ from transform circuit 220 and is equivalent to rotating voltage transform curve 120 by 45 degrees counter-clockwise. Rotation of a data point (x, y) by an angle Z (counter-clockwise) to a data point (x_r, y_r) can be accomplished mathematically using equations (1) and (2).

$$x\_r = (x*COS(Z)) - (y*SIN(Z)) \quad (1)$$

$$y\_r = (y*COS(Z)) + (y*SIN(Z)) \quad (2)$$

Therefore, the data points for transformed voltage transfer curve 420 can be derived from the data points of voltage transfer curve 120 using equations (3) and (4).

$$T\_V\_i = (V\_i*COS(45)) - (V\_o*SIN(45)) \quad (3)$$

$$T\_V\_o = (V\_i*COS(45)) + (V\_o*SIN(45)) \quad (4)$$

The points on voltage transform curve 120 having a slope of negative one would correspond to points on transformed voltage transfer curve 420 having a slope of zero. Points on a curve having a slope of zero correspond to local maximum values or local minimum values.

For transformed voltage transfer curve 420, a single maximum point and single minimum point exists. Thus, by detecting the maximum point on transform voltage curve 420, a transformed low threshold voltage value $T\_V\_il$ can be determined. Specifically, transformed low threshold voltage value $T\_V\_il$ is equal to the voltage level of transformed input voltage signal $T\_V\_i$ when transformed output voltage signal $T\_V\_o$ reaches a maximum value. Conversely, by detecting a minimum point on transform voltage curve 420, a transformed high threshold voltage value $T\_V\_ih$ can be determined. Specifically, transformed high threshold voltage value $T\_V\_il$ is equal to the voltage level of transformed input voltage signal $T\_V\_il$ when transformed output voltage signal $T\_V\_o$ reaches a minimum point on transformed voltage transfer curve 420.

As explained above, during simulation or testing a large set of data points is collected to derive voltage transfer curve 120. Similarly using the circuitry of FIG. 2, a large set of data points is generated to for transformed input voltage signal $T\_V\_i$ and transformed output voltage signal $T\_V\_o$ to derive transformed voltage transfer curve 420. Various methods can be used to find the maximum and minimum value of transformed output voltage signal $T\_V\_o$ and the corresponding values of transformed input voltage signal $T\_V\_i$ on transformed voltage transfer curve 420. For example, when the first data point is derived for transformed voltage transfer curve 420, the voltage level of output voltage signal $T\_V\_o$ is stored as both a maximum output voltage level $V\_o\_max$ and a minimum output voltage level $V\_o\_min$. Similarly, the voltage level of transformed input voltage signal $T\_V\_i$ is stored as both a maximum input voltage level $V\_i\_max$ and a minimum input voltage level $V\_i\_min$.

As each succeeding data point is derived for voltage transfer curve 420, the voltage level of transformed output voltage signal $T\_V\_o$ is compared to maximum output voltage level $V\_o\_max$ and minimum output voltage level $V\_o\_min$. If the voltage level of transformed output voltage signal $T\_V\_o$ is greater than maximum output voltage level $V\_o\_max$, then maximum output voltage level $V\_o\_max$ is set equal to the voltage level of transformed output voltage signal $T\_V\_o$ and maximum input voltage level $V\_i\_max$ is set equal to the voltage level of transformed input voltage signal $T\_V\_i$. Similarly, if the voltage level of transformed output voltage signal $T\_V\_o$ is less than minimum output voltage level $V\_o\_min$, then minimum output voltage level $V\_o\_min$ is set equal to the voltage level of transformed output voltage signal $T\_V\_o$ and minimum input voltage level $V\_i\_min$ is set equal to the voltage level of transformed input voltage signal $T\_V\_i$. Note that, many simulation tools and testers have built-in functions to determine the maximum and minimum points of a curve, thereby further simplifying the process.

After all data points are derived, transformed low threshold voltage level $T\_V\_il$ is set equal to maximum input voltage level V_i_max. Similarly, transformed high threshold voltage level T_V_ih is set equal to minimum input voltage level V_i_min. Then, low threshold voltage level V_il and high threshold voltage level V_ih can be derived by reversing the coordinate transformation. Mathematically, low threshold voltage V_il and high threshold voltage V_ih can be derived using equations (5) and (6), respectively.

$$V\_il = COS(45) * (T\_V\_il + V\_o\_max) \quad (5)$$

$$V\_ih\ 32\ COS(45) * (T\_V\_ih + V\_o\_min) \quad (6)$$

Figure 5:
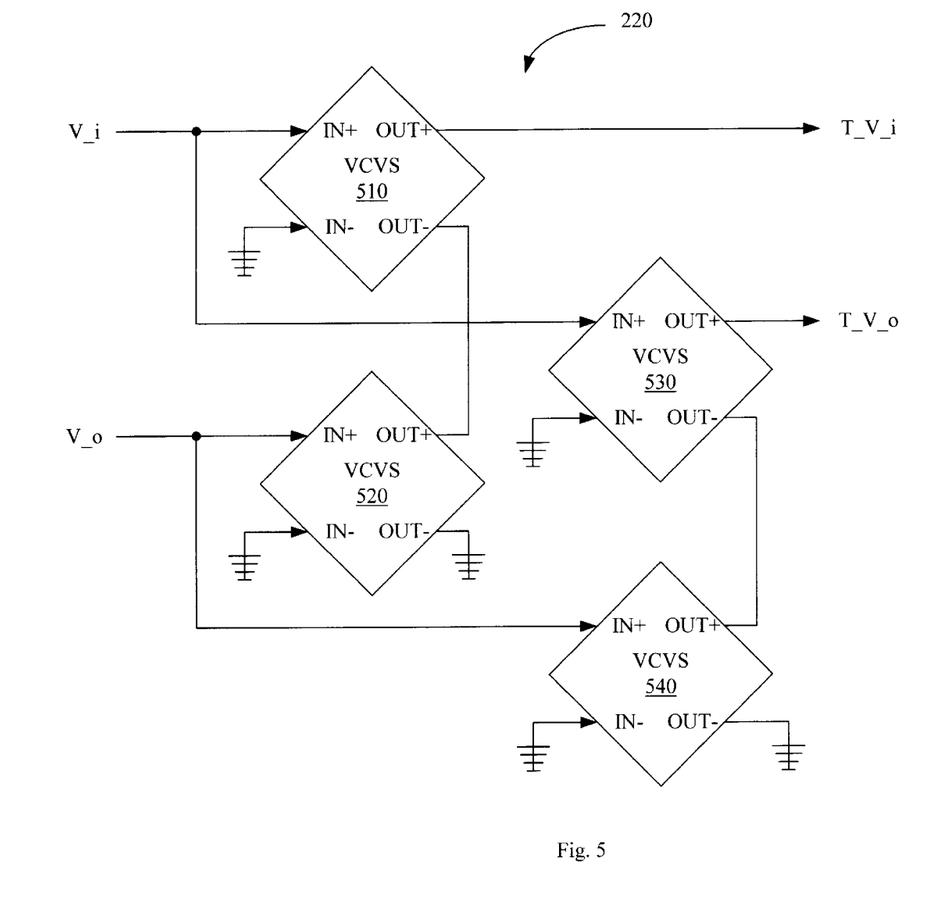
FIG. 5 is a schematic diagram of a transform circuit in accordance with one embodiment of the present invention.

FIG. 5 is an embodiment of transform circuit 220 in accordance with one embodiment of the present invention. The embodiment of FIG. 5 includes voltage controlled voltage sources (VCVS) 510, 520, 530, and 540. As explained above, transform circuit 220 is typically a model rather than an actual circuit. Thus, ideal voltage controlled voltage sources can be used. Consequently, in one embodiment of the present invention voltage controlled voltage sources 510, 520, 530, and 540 are all ideal voltage controlled voltage sources. Voltage controlled voltage sources 510 and 530 are controlled by the voltage level of input voltage signal V_i. Specifically, input voltage signal V_i is coupled to the positive input voltage terminals IN+ of voltage controlled voltage sources 510 and 530. Voltage controlled voltage sources 520 and 540 are controlled by the voltage level of output voltage signal V_o. Specifically, output voltage signal V_o is coupled to the positive input voltage terminals IN+ of voltage controlled voltage sources 520 and 540. The negative input voltage terminals IN− of voltage controlled voltage sources 510, 520, 530, and 540 are coupled to ground.

The output voltages of voltage controlled voltage sources 510 and 520 are summed together to generate transformed input voltage signal T_V_i at positive output voltage terminal OUT+ of voltage controlled voltage source 510. To perform this summation, negative output voltage terminal OUT− of voltage controlled voltage source 520 is coupled to ground. Positive output voltage terminal OUT+ of voltage controlled voltage source 520 is coupled to negative output voltage terminal OUT− of voltage controlled voltage source 510. The output voltages of voltage controlled voltage sources 530 and 540 are similarly summed to generate transformed output voltage signal T_V_o at positive output voltage terminal OUT+ of voltage controlled voltage source 530. Specifically, negative output voltage terminal OUT− of voltage controlled voltage sources 540 is coupled to ground. Positive output voltage terminal OUT+ of voltage controlled voltage source 540 is coupled to negative output voltage terminal OUT− of voltage controlled voltage source 530.

To rotate voltage transfer curve 120 as illustrated in FIG. 3, voltage controlled voltage sources 510, 520, 530, and 540 are designed to have a voltage gain equal to the sine of 45 degrees (i.e., SIN(45)), negative cosine of 45 degrees (i.e., −COS (45)), sine of 45 degrees (i.e., SIN (45)), and cosine of 45 degrees (i.e., COS (45)), respectively.

Figure 6:
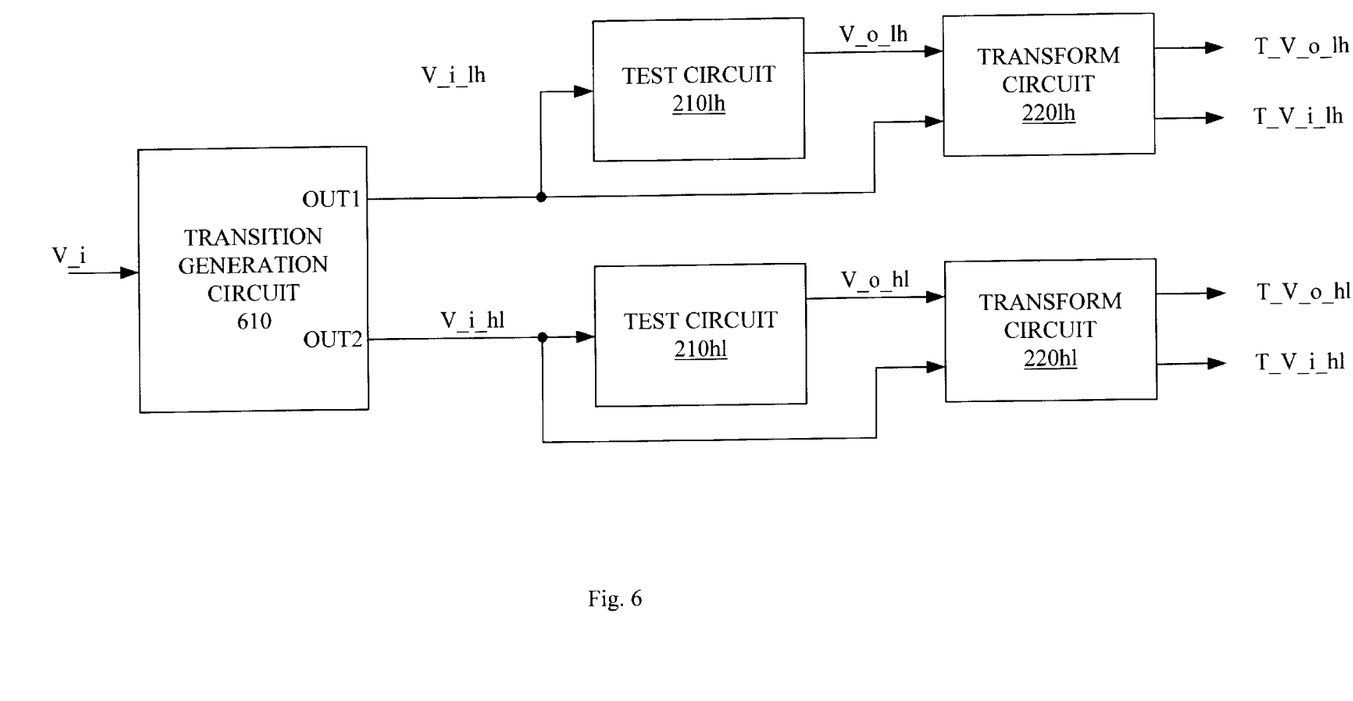
FIG. 6 is a schematic diagram of an embodiment of the present invention.

As explained above, some integrated circuits have a different voltage transfer curve for a logic low to a logic high transition as compared to a logic high to logic low transition. FIG. 6 illustrates an embodiment of the present invention that derives threshold voltages for both low-to-high and high-to-low transitions simultaneously. The embodiment of FIG. 6 includes test circuits 210lh and 210hl, transform circuits 220lh and 220hl, and a transition generation circuit 610. Test circuits 210lh and 210hl are duplicates of test circuit 210. Similarly, transform circuits 220hl and 220lh are duplicates of transform circuit 220. For clarity, circuits and signals in FIG. 6 using reference names ending with "lh" correspond to an input voltage signal V_i_lh, which transitions from logic low to logic high. Conversely, circuits and signals using reference names ending with "hl" correspond to an input voltage signal V_i_hl, which transitions from logic high to logic low.

In this embodiment, input voltage signal V_i, provided to transition generation circuit 610, is configured to transition from logic low to logic high or from logic high to logic low. Transition generation circuit 610 generates input voltage signals V_i_lh and V_i_hl, which are input signals for test circuit 210lh and test circuit 210hl, respectively. Input voltage signals V_i_lh and V_i_hl are also provided to transform circuits 220lh and 220hl, respectively. Test circuits 210lh and 210hl produce output voltage signals V_o_lh and V_o_hl, respectively. Transform circuit 220lh produces transformed output voltage signal T_V_o_lh and transformed input voltage signal T_V_i_lh in a manner similar to that described above with respect to transform circuit 220. For brevity, the description is not repeated. Similarly, transform circuit 220hl produces transformed output voltage signal T_V_o_hl and transformed input voltage signal T_V_i_hl.

Using the embodiment of FIG. 6 and the techniques described above, low threshold voltage levels V_il can be calculated for both low-to-high transitions of test circuit 210 and high-to-low transitions of test circuit 210 simultaneously. Similarly, high threshold voltage levels V_ih can be calculated for both low-to high transitions of test circuit 210 and high-to-low transitions of test circuit 210 simultaneously.

Figure 7:
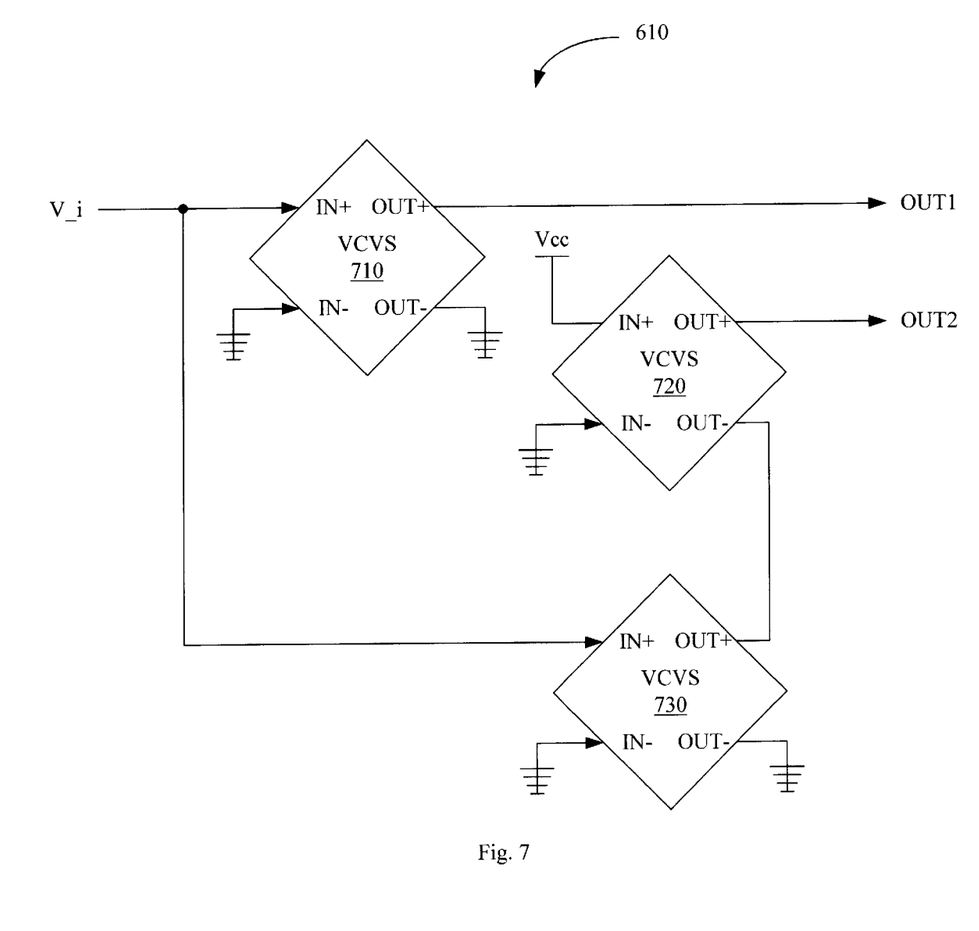
FIG. 7 is a schematic diagram of a transition generation circuit in accordance with one embodiment of the present invention.

FIG. 7 shows an embodiment of transition generation circuit 610 (FIG. 6) which includes voltage controlled voltage sources 710, 720, and 730. Voltage controlled voltage sources 710 and 730 are controlled by the voltage level of input voltage signal V_i. Specifically, input voltage signal V_i is coupled positive input terminals IN+ of voltage controlled voltage sources 710 and 730, while negative input voltage terminals IN− of voltage controlled voltage sources 710 and 730 are coupled ground. Voltage controlled voltage source 710 is configured to provide a gain of positive one and to drive output voltage signal OUT1 at positive output voltage terminal OUT+ of voltage controlled voltage source 710. Negative output terminal OUT− of voltage controlled voltage source 710 is coupled to ground. Note that, output voltage signal OUT1 mirrors input voltage signal V_i. Thus, if input voltage signal V_i transitions from logic low to logic high, output voltage signal OUT1 also transitions for logic low to logic high.

Voltage controlled voltage source 720 is configured to have a gain of positive one. Positive input voltage terminal IN+ of voltage controlled voltage source 720 is coupled to voltage source Vcc, while Negative input voltage terminal IN− of voltage controlled voltage source 720 is coupled to ground. Voltage controlled voltage source 730 has a gain of negative one. The output voltages of voltage controlled voltage sources 720 and 730 are added together. Specifically, negative output voltage terminal OUT− of voltage controlled voltage sources 730 is coupled to ground. Positive output voltage terminal OUT+_ of voltage controlled voltage source 730 is coupled to negative output voltage terminal OUT− of voltage controlled voltage source 720. Effectively, output voltage signal OUT2 from positive output voltage terminal OUT+ of voltage controlled voltage source 720 is inverted from input voltage signal V_i. Thus, if input voltage signal V_i transitions from logic low to logic high, output voltage signal OUT2 transitions from logic high to logic low. Thus, for the embodiment of FIG. 6, if input voltage signal V_i transitions from logic low to logic high, output voltage signal OUT1 should be used for input voltage signal V_i_lh and output voltage signal OUT2 should be used for input voltage signal V_i_hl.

Figure 8:
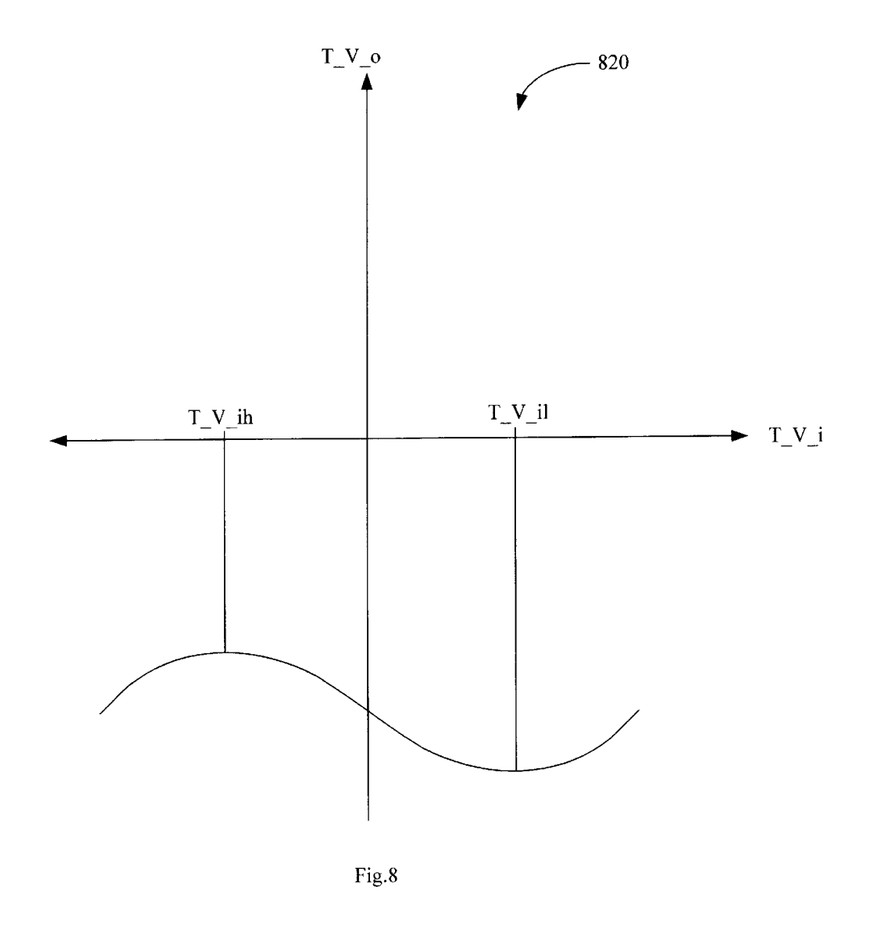
FIG. 8 is a voltage transfer curve using a transformed coordinate system in accordance with one embodiment of the present invention.

In accordance with the present invention, voltage transfer curve 120 (FIG. 1) can also be rotated 135 degrees (counter-clockwise) to form transformed voltage transfer curve 820, as illustrated in FIG. 8. If a rotation of 135 degrees is used, then transformed high threshold voltage T_V_ih is determined by finding the maximum point of voltage transfer curve 820. Conversely, transformed low threshold voltage T_V_il is determined by finding the minimum point of voltage transfer curve 820.

In the various embodiments of this invention, methods and structures have been described to quickly determine low threshold voltage V_il and high threshold voltage V_ih. Rather than finding the points on a voltage transfer curve having a slope of negative one, maximum and minimum points are determined on transformed voltage transfer curves to calculate the threshold voltages. Because maximum and minimum points on a transformed voltage transfer curve can be determined much more rapidly and accurately than determining the slope of a voltage transfer curve, the present invention can quickly and accurately calculate threshold voltages.

The various embodiments of the structures and methods of this invention that are described above are illustrative of the principles of this invention and are not intended to limit the scope of the invention to the particular embodiments described. For example, in view of this disclosure, those skilled in the art can define other test circuits, transform circuits, rotational angles, and so forth, and use these alternative features to create a method, circuit, or system according to the principles of this invention. Thus, the invention is limited only by the following claims.

What is claimed is:

1. A method to calculate a threshold voltage of a test circuit, the method comprising:
   creating a transformed voltage transfer curve for the test circuit; and
   determining a maximum point of the transformed voltage transfer curve.

2. The method of claim 1, further comprising setting a transformed threshold voltage equal to a coordinate of the maximum point.

3. The method of claim 2, further comprising transforming the transformed voltage threshold to the threshold voltage.

4. The method of claim 1, wherein the threshold voltage is a low threshold voltage.

5. The method of claim 1, wherein the threshold voltage is a high threshold voltage.

6. The method of claim 1, wherein the transformed voltage transfer curve is equivalent to a voltage transfer curve for the test circuit rotated by an angle.

7. The method of claim 6, wherein the angle is 45 degrees.

8. The method of claim 6, wherein the angle is 135 degrees.

9. A method to calculate a threshold voltages of a test circuit, the method comprising:
   creating a transformed voltage transfer curve for the test circuit; and
   determining a minimum point of the transformed voltage transfer curve.

10. The method of claim 9, further comprising setting a transformed threshold voltage equal to a coordinate of the minimum point.

11. The method of claim 10, further comprising transforming the transformed voltage threshold to the threshold voltage.

12. A method to calculate a first threshold voltage and a second threshold voltage of a test circuit, the method comprising:
   creating a transformed voltage transfer curve for the test circuit;
   determining a minimum point of the transformed voltage transfer curve; and
   determining a maximum point of the transformed voltage transfer curve.

13. The method of claim 12, further comprising:
   setting a first transformed threshold voltage equal to a coordinate of the minimum point; and
   setting a second transformed threshold voltage equal to a coordinate of the maximum point.

14. The method of claim 13, further comprising:
   transforming the first transformed voltage threshold to the first threshold voltage; and
   transforming the second transformed voltage threshold to the second threshold voltage.

15. The method of claim 12, wherein the first voltage threshold is a low voltage threshold and the second voltage threshold is a high voltage threshold.

16. A simulation tool comprising:
   a first test circuit model configured to receive an input voltage signal and to generate an output voltage signal; and
   a first transform circuit model configured to receive the input voltage signal and the output voltage signal and to generate a transformed input voltage signal and a transformed output voltage signal.

17. The simulation tool of claim 16, wherein the transform circuit model is configured to rotate a voltage transfer curve of the circuit model by 45 degrees.

18. The simulation tool of claim 16, wherein the first transform circuit comprises:
   a first voltage controlled voltage source configured to receive the input voltage signal and to generate the transformed input voltage signal;
   a second voltage controlled voltage source coupled to the first voltage controlled voltage source and configured to receive the output voltage signal.

19. The simulation tool of claim 18, wherein the second voltage controlled voltage source is coupled to the first voltage controlled voltage source.

20. The simulation tool of claim 18, wherein the first transform circuit comprises:
   a third voltage controlled voltage source configured to receive the input voltage signal and to generate the transformed output voltage signal;
   a fourth voltage controlled voltage source coupled to the first voltage controlled voltage source and configured to receive the output voltage signal.

21. The simulation tool of claim 20, wherein the fourth voltage controlled voltage source is coupled to the third voltage controlled voltage source.

22. A circuit to calculate a threshold voltage of a test circuit, the circuit comprising:
   means for creating a transformed voltage transfer curve for the test circuit; and
   means for determining a maximum point of the transformed voltage transfer curve.

23. The circuit of claim 22, further comprising means for setting a transformed threshold voltage equal to a coordinate of the maximum point.

24. The circuit of claim 23, further comprising means for transforming the transformed voltage threshold to the threshold voltage.

25. The circuit of claim 22, wherein the threshold voltage is a low threshold voltage.

26. The circuit of claim 22, wherein the threshold voltage is a high threshold voltage.

27. The circuit of claim 22, wherein the transformed voltage transfer curve is equivalent to a voltage transfer curve for the test circuit rotated by an angle.

28. The circuit of claim 27, wherein the angle is 45 degrees.

29. The circuit of claim 27, wherein the angle is 135 degrees.

* * * * *